(12) United States Patent
Chiba et al.

(10) Patent No.: US 10,607,908 B2
(45) Date of Patent: Mar. 31, 2020

(54) SEMICONDUCTOR DEVICE

(71) Applicant: NuFlare Technology, Inc., Yokohama-shi (JP)

(72) Inventors: Kazuhiro Chiba, Sagamihara (JP); Yoshikuni Goshima, Yokohama (JP); Shinsuke Nabeya, Chuo-ku (JP); Shiro Okada, Sagamihara (JP); Kentaro Mori, Fujisawa (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/009,753

(22) Filed: Jun. 15, 2018

(65) Prior Publication Data
US 2018/0374768 A1 Dec. 27, 2018

(30) Foreign Application Priority Data
Jun. 22, 2017 (JP) .................................. 2017-121996

(51) Int. Cl.
| | |
|---|---|
| *H01L 23/16* | (2006.01) |
| *H01L 23/00* | (2006.01) |
| *H01L 23/15* | (2006.01) |
| *H01J 37/147* | (2006.01) |
| *H01L 23/14* | (2006.01) |

(Continued)

(52) U.S. Cl.
CPC ............ *H01L 23/16* (2013.01); *H01J 37/147* (2013.01); *H01L 23/145* (2013.01); *H01L 23/15* (2013.01); *H01L 23/562* (2013.01); *H01L 24/32* (2013.01); *H01L 24/48* (2013.01); *H01L 29/06* (2013.01); *H01L 23/13* (2013.01); *H01L 2224/32227* (2013.01); *H01L 2224/45144* (2013.01); *H01L 2224/48227* (2013.01)

(58) Field of Classification Search
CPC combination set(s) only.
See application file for complete search history.

(56) References Cited

U.S. PATENT DOCUMENTS

| | | | |
|---|---|---|---|
| 8,981,574 B2 * | 3/2015 | Kim ........................ | H01L 24/73 257/777 |
| 9,502,347 B2 * | 11/2016 | Shen ................... | H01L 25/0652 |

(Continued)

FOREIGN PATENT DOCUMENTS

| | | |
|---|---|---|
| JP | 2004-282038 | 10/2004 |
| JP | 2007-266525 A | 10/2007 |
| TW | 201225145 A1 | 6/2012 |

OTHER PUBLICATIONS

Taiwanese Office Action and Search Report dated Apr. 12, 2019 in Patent Application No. 107118619, 9 pages (with unedited computer generated English translation).

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A semiconductor device according to an embodiment includes a semiconductor chip including a region having through holes; a substrate having a first opening larger than the region, the substrate containing a resin or a ceramic; a spacer provided between the semiconductor chip and the substrate, the spacer having a second opening larger than the region; a first bond provided between the semiconductor chip and the spacer; and a second bond provided between the spacer and the substrate.

15 Claims, 8 Drawing Sheets

(51) Int. Cl.
*H01L 29/06* (2006.01)
*H01L 23/13* (2006.01)

(56) References Cited

U.S. PATENT DOCUMENTS

2004/0169147 A1    9/2004  Ono et al.
2012/0115306 A1    5/2012  Yamazaki et al.
2013/0112891 A1    5/2013  Kato
2018/0182717 A1*  6/2018  Shilimkar ............... H01L 23/86

* cited by examiner

SEMICONDUCTOR DEVICE

CROSS-REFERENCE TO RELATED APPLICATION

This application is based upon and claims the benefit of priority from Japanese Patent Applications No. 2017-121996, filed on Jun. 22, 2017, the entire contents of which are incorporated herein by reference.

FIELD OF THE INVENTION

Embodiments described herein relate generally to a semiconductor device.

BACKGROUND OF THE INVENTION

In order to deflect a plurality of charged particle beams, a deflector including a semiconductor chip having through holes passing the charged particle beams is used. Each through holes has a pair of electrodes, and each charged particle beam is independently deflected by an electric field applied between the pair of electrodes.

The semiconductor chip may be bonded onto a substrate having openings corresponding to the through holes. It is required to arrange the through holes with a high positional accuracy so that the plurality of charged particle beams pass through the through holes.

SUMMARY OF THE INVENTION

According to an aspect of the invention, a semiconductor device includes a semiconductor chip including a region having through holes; a substrate having a first opening larger than the region, the substrate containing a resin or a ceramic; a spacer provided between the semiconductor chip and the substrate, the spacer having a second opening larger than the region; a first bond provided between the semiconductor chip and the spacer; and a second bond provided between the spacer and the substrate.

DETAILED DESCRIPTION OF THE EMBODIMENTS

Figure 1A:
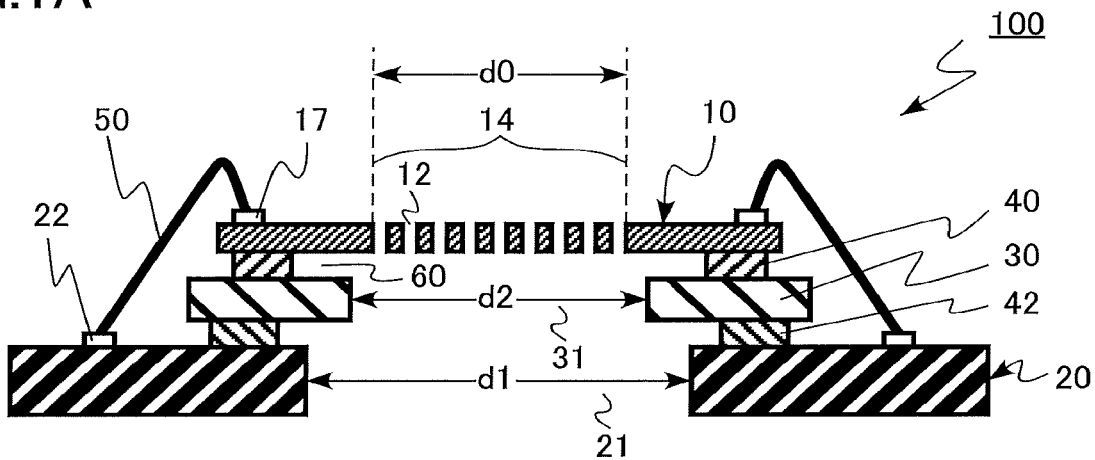
FIGS. 1A and 1B are schematic views illustrating a semiconductor device according to an embodiment.

In this specification, the same or similar components are denoted by the same reference numerals, and redundant description thereof may be omitted.

In this specification, in order to indicate positional relationships of members, the upward direction of the drawings may be expressed by "upper", and the lower direction of the drawing may be expressed by "lower". In this specification, the concepts of "upper" and "lower" are not necessarily terms indicating the relationship with the direction of gravity.

A semiconductor device according to an embodiment includes a semiconductor chip including a region including through holes; a substrate including a first opening larger than the region, the substrate containing a resin or a ceramic; a spacer provided between the semiconductor chip and the substrate, the spacer including a second opening larger than the region; a first bond provided between the semiconductor chip and the spacer; and a second bond provided between the spacer and the substrate.

Figure 1B:
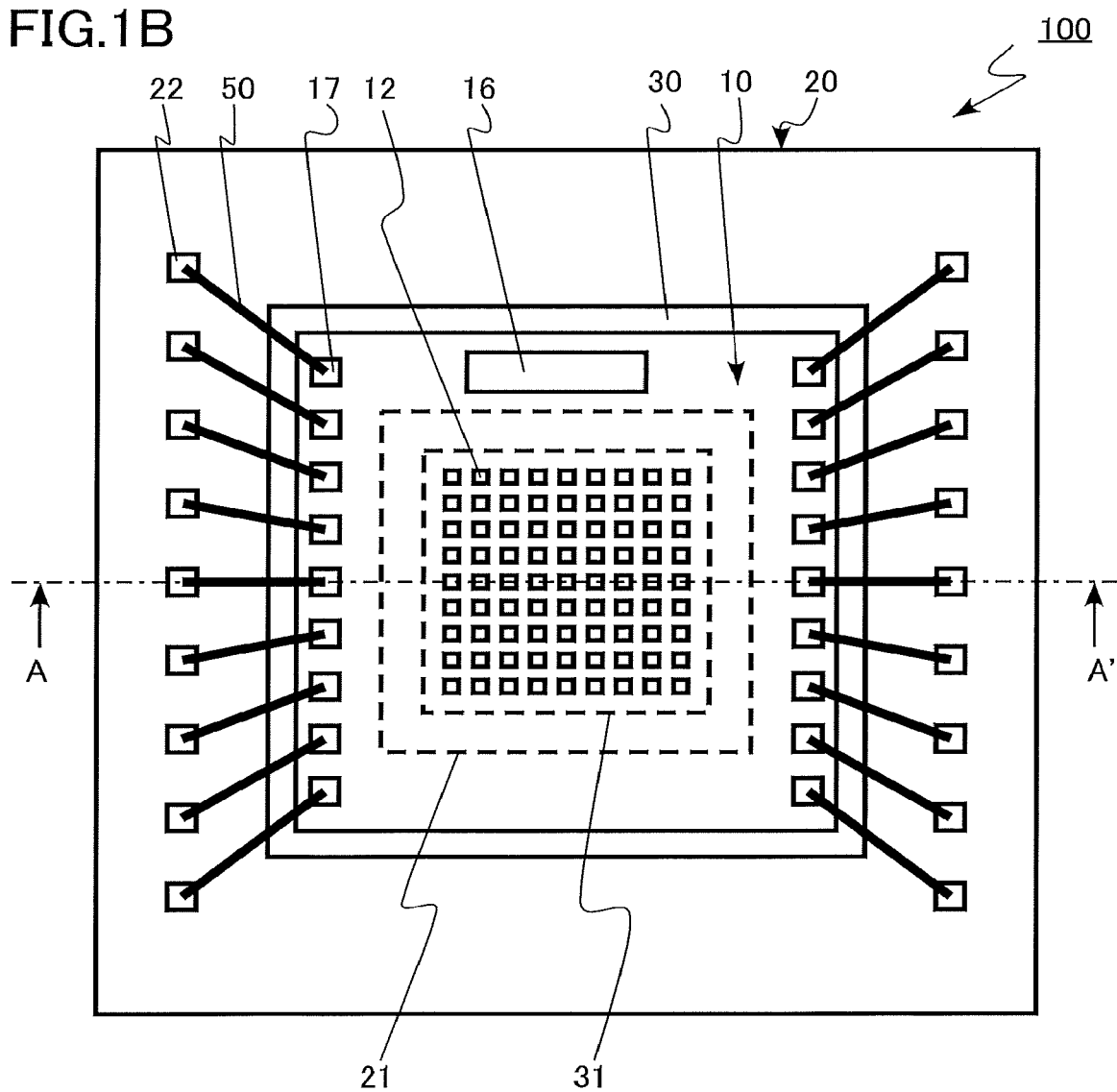

FIGS. 1A and 1B are schematic views illustrating a semiconductor device according to an embodiment. FIG. 1A is a cross-sectional view, and FIG. 1B is a top view. FIG. 1A is a cross-sectional view taken along line AA' of FIG. 1B.

The semiconductor device according to the embodiment is a deflector 100 used in a multi-beam type electron beam drawing apparatus. The multi-beam type electron beam drawing apparatus draws a pattern on a sample by using a plurality of electron beams.

The deflector 100 has a function of individually deflecting each of the plurality of electron beams. For example, by combining the deflector 100 and an aperture that shields the electron beams, irradiation and non-irradiation of each electron beams on the sample can be controlled independently.

As illustrated in FIGS. 1A and 1B, the deflector 100 (semiconductor device) includes a semiconductor chip 10, a substrate 20, a spacer 30, a first bond 40 (first bonding material), and a second bond 42 (second bonding material). The spacer 30 is provided between the semiconductor chip 10 and the substrate 20. The first bond 40 is provided between the semiconductor chip 10 and the spacer 30. The second bond 42 is provided between the spacer 30 and the substrate 20.

The semiconductor chip 10 is provided with a region 14 having a plurality of through holes 12 at the center thereof. The electron beam passes through each of the through holes 12. In FIG. 1B, a case where a total of 81 through holes 12, that is, nine through holes laterally and nine through holes vertically, are arrayed is exemplified, but the number of the through holes 12 and the shape of the arrangement are not limited to the above-described embodiment.

Figure 2A:
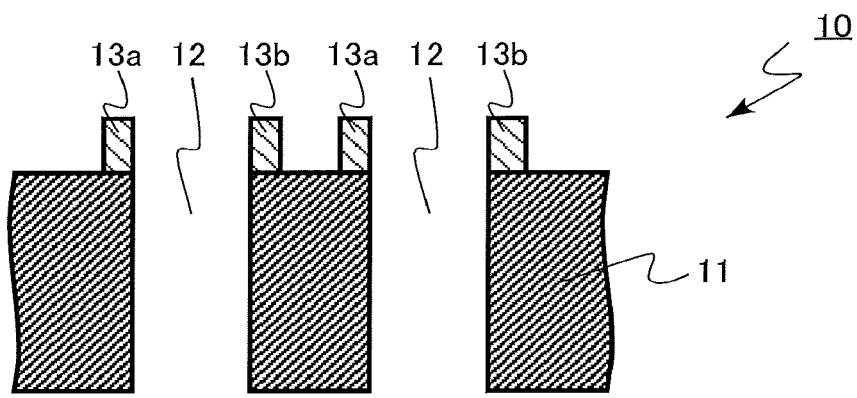
FIGS. 2A and 2B are enlarged schematic views illustrating a portion of a semiconductor chip according to the embodiment.
Figure 2B:
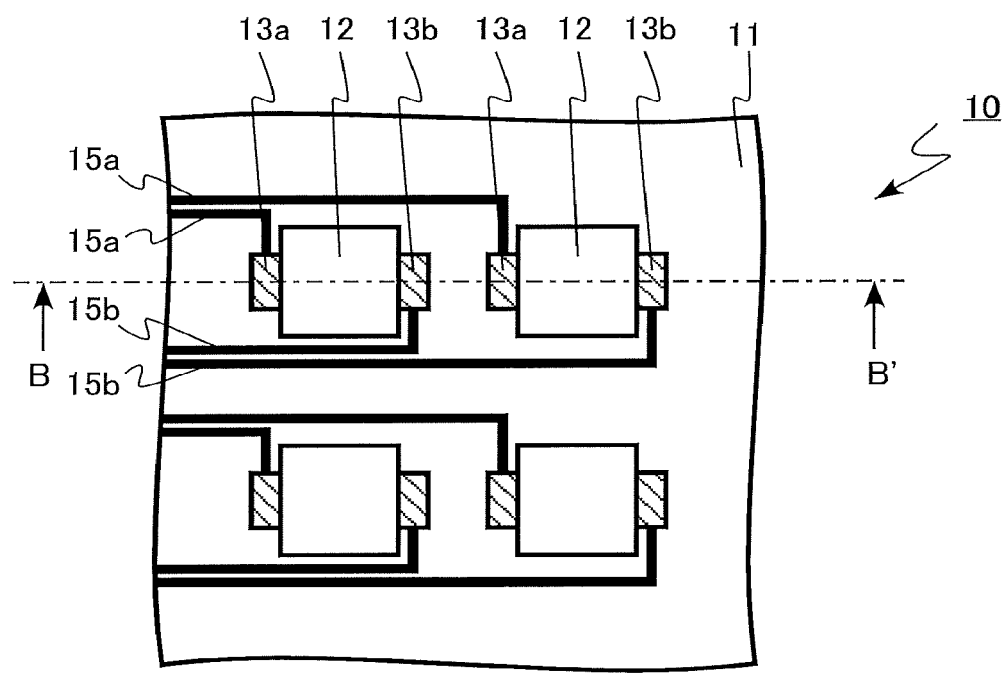

FIGS. 2A and 2B are enlarged schematic views illustrating a portion of the semiconductor chip 10 according to the embodiment. FIGS. 2A and 2B are enlarged views illustrating a portion of the region 14. FIG. 2A is a cross-sectional view, and FIG. 2B is a top view. FIG. 2A is a cross-sectional view taken along line BB' of FIG. 2B.

The through hole 12 penetrates the semiconductor layer 11. The semiconductor layer 11 is, for example, a silicon layer.

The semiconductor chip 10 includes pairs of electrodes and wiring layers. A pair of control electrodes 13a and 13b is provided on the semiconductor layer 11 with the through hole 12 interposed therebetween. Furthermore, an electrode wiring layer 15a for applying a voltage to the control electrode 13a and an electrode wiring layer 15b for applying a voltage to the control electrode 13b are provided. The electrode wiring layers 15a and 15b may be provided on the surface of the semiconductor layer 11 or as internal layers constituting the semiconductor layer 11. By controlling the voltage applied between the control electrode 13a and the control electrode 13b, deflection control of the electron beam passing through the through hole 12 is performed.

As illustrated in FIG. 1B, the semiconductor chip 10 is provided with a control circuit 16. The control circuit 16 has, for example, a function of controlling voltages to be applied to the pair of control electrodes 13a and 13b. The control circuit 16 is configured with, for example, a circuit including a plurality of transistors formed in the semiconductor layer 11. The control circuit 16 and the control electrodes 13a and 13b are electrically connected to each other, for example, by electrode wiring layers 15a and 15b. For example, the control circuit may be provided for each of the control electrodes 13a and 13b.

The semiconductor chip 10 includes a plurality of first electrode pads 17. The first electrode pad 17 is provided on the semiconductor layer 11. The first electrode pad 17 is provided to apply a voltage to the semiconductor chip 10 from the outside. The first electrode pad 17 is electrically connected to, for example, the control circuit 16 or the control electrodes 13a and 13b.

The thickness of the semiconductor chip 10 is required to be a thickness capable of forming the through hole 12 having a desired aspect ratio. For example, the thickness of the semiconductor chip 10 needs to be made very thin so that the electron beam illuminated on the semiconductor chip 10 can obliquely pass through the through hole 12. When a reduction optical system is applied, the electron beam may become oblique with regard to the through hole 12. The thickness of the semiconductor chip 10 is, for example, 10 µm or more and 500 µm or less. In addition, it is also possible to further reduce the thickness of the semiconductor chip 10 as the irradiation area becomes narrower.

The substrate 20 is, for example, a circuit board. The substrate 20 has a function of supporting the semiconductor chip 10. In addition, the substrate 20 has a function of transmitting a voltage applied from the outside of the deflector 100 to the semiconductor chip.

The substrate 20 is, for example, a printed board containing a resin. In addition, the substrate 20 is, for example, a ceramic board including a ceramic.

The substrate 20 is provided, for example, with a wiring layer (not illustrated). The surface of the substrate 20 is covered with a conductive material such as gold plating to avoid charge-up due to electron beam irradiation.

The substrate 20 is provided with a first opening 21. A plurality of electron beams pass through the first opening 21.

As illustrated in FIG. 1B, the first opening 21 is larger than the region 14. When viewed from the upper surface of the semiconductor chip 10, the first opening 21 is provided so as to surround the periphery of the region 14. As illustrated in FIG. 1A, the diameter (d1) of the first opening 21 is larger than the diameter (d0) of the region 14.

The substrate 20 has a plurality of second electrode pads 22 on the upper surface thereof. The second electrode pad 22 is connected to the first electrode pad 17 of the semiconductor chip 10 by a bonding wire 50. The bonding wire 50 is, for example, a gold wire.

The spacer 30 has a function of alleviating the stress applied to the semiconductor chip 10 during the manufacturing the deflector 100. It is preferable that the spacer 30 has a thermal expansion coefficient close to that of the semiconductor chip 10 and a high compression strength. The spacer 30 is made of, for example, a semiconductor or an insulator. The spacer 30 is made of, for example, silicon, silicon carbide, or quartz glass. The surface of the spacer 30 is covered with a conductive material such as gold plating to avoid charge-up by electron beam irradiation.

The spacer 30 is provided with a second opening 31. A plurality of electron beams pass through the second opening 31.

As illustrated in FIG. 1B, the second opening 31 is larger than the region 14. The area of the second opening 31 is larger than the area of the region 14. In addition, for example, the second opening 31 is larger than the region 14 and smaller than the first opening 21. The area of the second opening 31 is larger than the area of the region 14 and smaller than the area of the first opening 21. When viewed from the upper surface of the semiconductor chip 10, the second opening 31 is provided so as to surround the periphery of the region 14. In addition, the first opening 21 is provided so as to surround the periphery of the second opening 31. The end of the second opening 31 is between the end of the region 14 and the end of the first opening 21.

As illustrated in FIG. 1A, the diameter (d2) of the second opening 31 is larger than the diameter (d0) of the region 14. In addition, for example, the diameter (d2) of the second opening 31 is smaller than the diameter (d1) of the first opening 21.

The thermal expansion coefficient of the spacer 30 is, for example, smaller than the thermal expansion coefficient of the substrate 20. The thermal expansion coefficient of the spacer 30 is, for example, 6 ppm/K or less.

The thickness of the spacer 30 may be larger than the thickness of the semiconductor chip 10. The thickness of the spacer 30 is, for example, 0.2 mm or more and 5 mm or less. The length of one side of the outer periphery of the spacer 30 is, for example, 20 mm or more and 50 mm or less.

As illustrated in FIG. 1A, for example, a gap 60 exists between the spacer 30 and the semiconductor chip 10. The width of the gap 60, that is, the distance between the spacer 30 and the semiconductor chip 10 is, for example, 2 µm or more and 100 µm or less.

The semiconductor chip 10 and the spacer 30 are bonded by the first bond 40. The material of the first bond 40 is, for example, a conductive material. The first bond 40 is, for example, a silver paste or a solder. The first bond 40 is, for example, a material having a curing temperature or a melting point of 200° C. or less. The thickness of the first bond 40 is, for example, 1 µm or more and 100 µm or less.

Figure 3A:
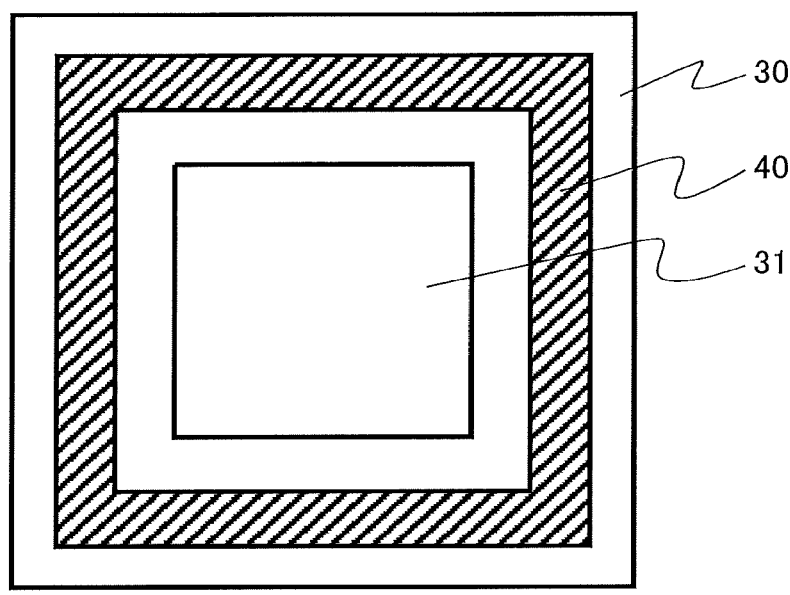
FIGS. 3A and 3B are top views illustrating an arrangement pattern of a first bond according to the embodiment.
Figure 3B:
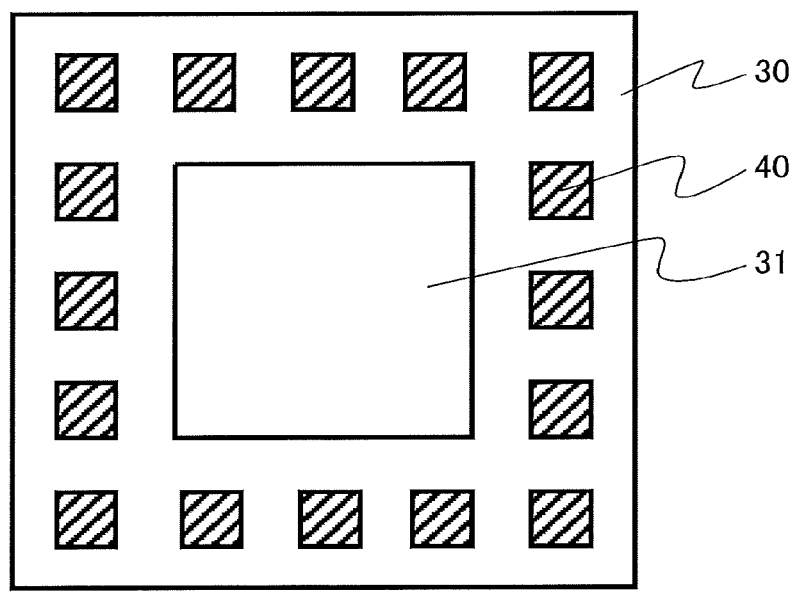

FIGS. 3A and 3B are top views illustrating possible arrangement patterns of the first bond 40 according to the embodiment. For example, as illustrated in FIG. 3A, the first bond 40 is provided continuously on the upper surface of the spacer 30 so as to surround the periphery of the second opening 31. In addition, as illustrated in FIG. 3B, for example, the first bond 40 is provided to be divided into a plurality of portions. The first bond 40 is consists of a plurality of portions in FIG. 3B.

The spacer 30 and the substrate 20 are bonded by the second bond 42. The material of the second bond 42 is, for example, a conductive material. The second bond 42 is, for example, a silver paste or a solder. The second bond 42 is, for example, a material having a curing temperature or a melting point of 200° C. or less. The thickness of the second bond 42 is, for example, 1 µm or more and 100 µm or less.

Next, functions and effects of the semiconductor device according to the embodiment will be described.

In a deflector that deflects a plurality of electron beams, it is required to arrange the through holes with a high positional accuracy so that the plurality of electron beams pass through holes provided in the semiconductor chip. In particular, if the number of through holes increases or the size of the deflector becomes small, it is required to arrange the through holes with a much higher positional accuracy. For example, through a thermal process during the manufacturing the deflector, the semiconductor chip may be warped due to stress and the positional accuracy of the through holes may be decreased.

Figure 4A:
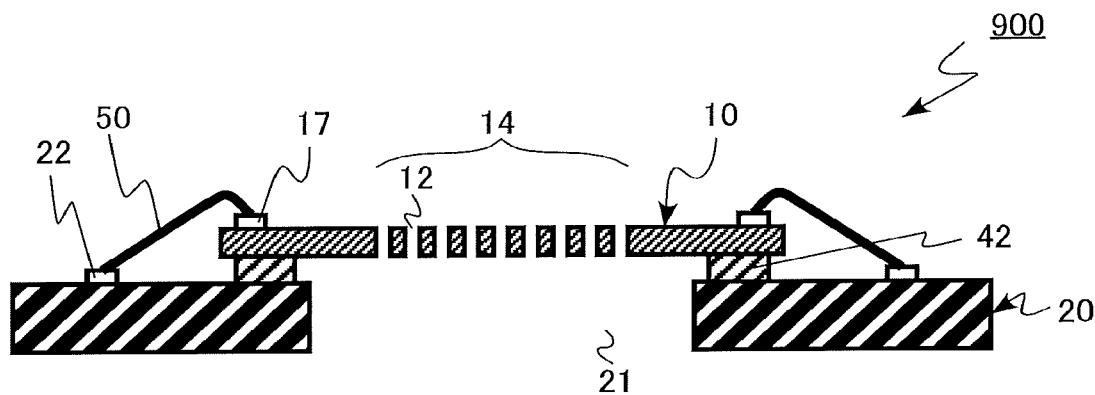
FIGS. 4A and 4B are schematic views illustrating a semiconductor device according to a comparative embodiment.
Figure 4B:
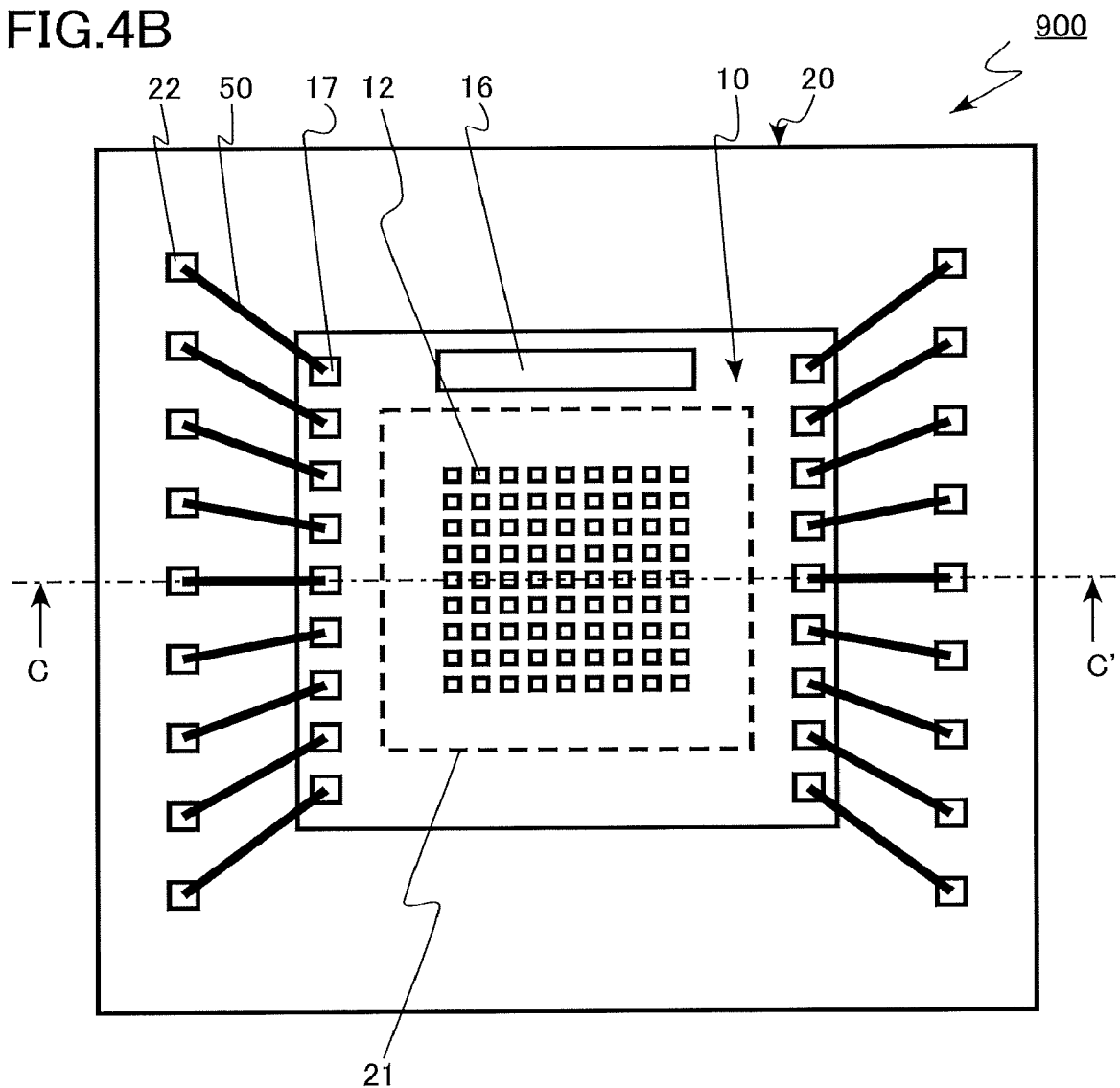

FIGS. 4A and 4B are schematic views illustrating a semiconductor device according to a comparative embodiment. FIG. 4A is a cross-sectional view, and FIG. 4B is a top view. FIG. 4A is a cross-sectional view taken along the line CC' of FIG. 4B.

Similarly to the embodiment, the semiconductor device according to the comparative embodiment is a deflector 900 used in a multi-beam type electron beam drawing apparatus. The deflector 900 is the same as the deflector 100 according to the embodiment except that the deflector 900 has no spacer 30. The semiconductor chip 10 and the substrate 20 are bonded by the second bond 42.

Figure 5A:
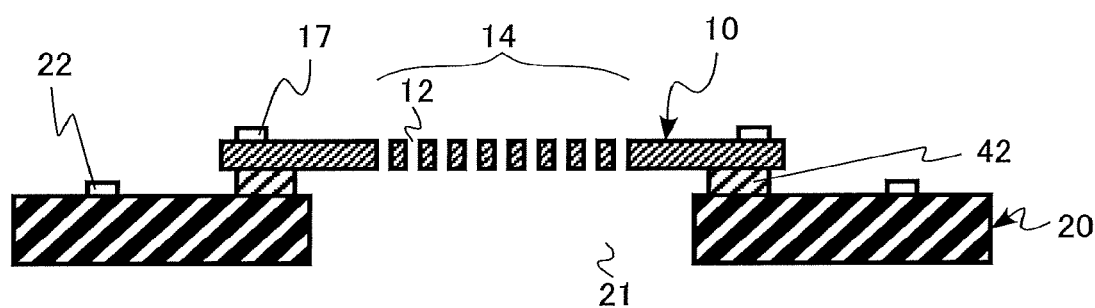
FIGS. 5A and 5B are explanatory views illustrating problems of the semiconductor device according to the comparative embodiment.
Figure 5B:
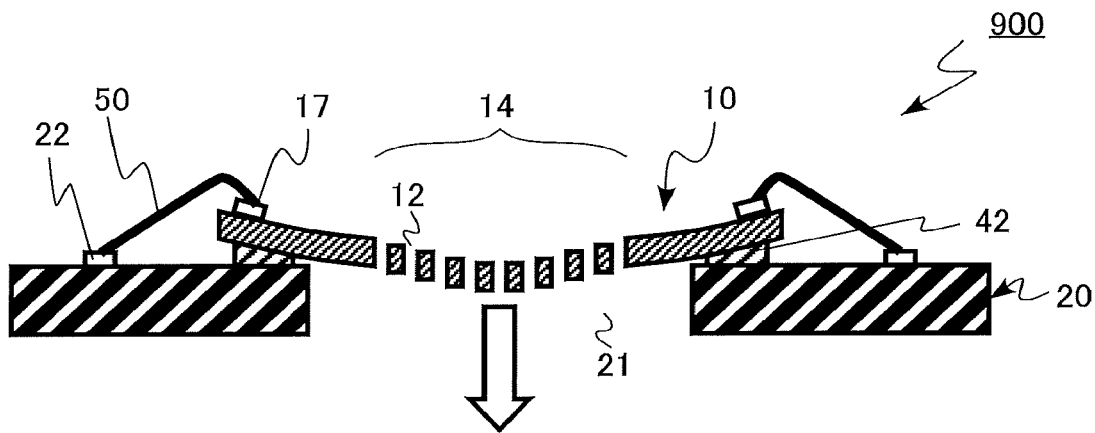

FIGS. 5A and 5B are explanatory views illustrating problems of the semiconductor device according to the comparative embodiment. FIGS. 5A and 5B are schematic cross-sectional views illustrating the semiconductor device according to the comparative embodiment.

FIG. 5A is a view illustrating a state after the semiconductor chip 10 is mounted on the substrate 20. FIG. 5A is a view illustrating a state before a thermal process associated with bonding and wire bonding is performed. FIG. 5B is a view illustrating a state after the thermal process associated with bonding and wire bonding is performed.

In the deflector 900 according to the comparative embodiment, as illustrated in FIG. 5B, the semiconductor chip 10 is greatly warped due to the stress after the thermal process. The warp of the semiconductor chip 10 is considered to be caused by the difference between the thermal expansion coefficient of the semiconductor chip 10 and the thermal expansion coefficient of the substrate 20. It is considered that the warp of the semiconductor chip 10 occurs due to the difference in displacement amount caused by thermal contraction between the semiconductor chip 10 and the substrate 20 at the time of temperature decrease in the thermal process.

FIG. 4A is a cross-sectional view illustrating an ideal state in which the warp of the semiconductor chip 10 by the thermal process is ignored.

Figure 6:
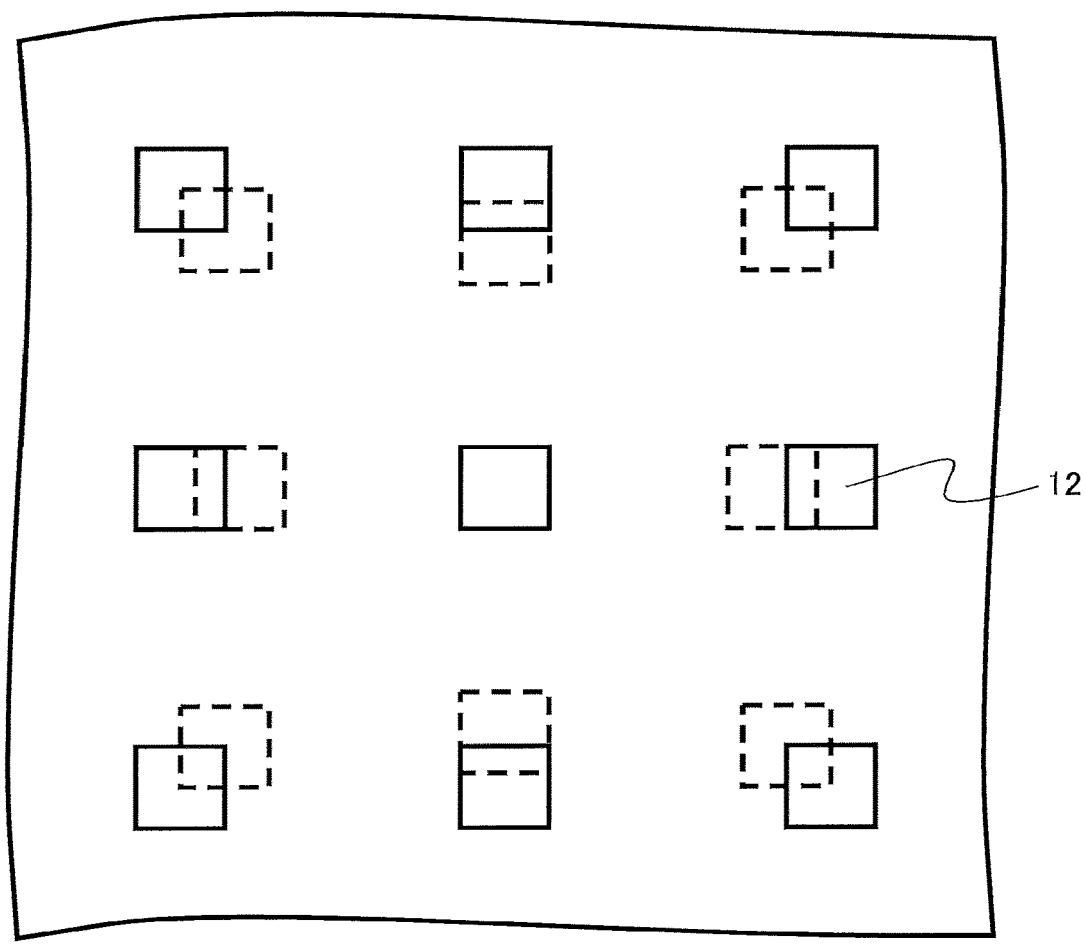
FIG. 6 is an explanatory view illustrating problems of the semiconductor device according to the comparative embodiment.

FIG. 6 is an explanatory view illustrating problems of the semiconductor device according to the comparative embodiment. As illustrated in FIG. 6, as the semiconductor chip 10 is warped, the lateral positions of the through holes 12 are displaced. In addition, the other through holes (not drawn) are also displaced in the same manner. The solid line indicates the through hole 12 before the displacement, and the dotted line indicates the through hole 12 after the displacement. The size of the electron beam is smaller than the diameter of the through hole 12. For this reason, for example, even if there is a displacement in the semiconductor chip 10, the electron beam can pass through the through hole 12 as long as the displacement is small. The displacement may be small in the center portion of the semiconductor chip 10. However, since the displacement is large at the outer peripheral portion of the semiconductor chip 10, the electron beam is irradiated to the outside of the corresponding through hole 12, so that there occurs a problem in that a portion of the electron beam cannot pass through the through hole. In particular, when a reduction optical system is applied as described above, since the electron beam obliquely passes through the through hole 12, the margin of passage is further decreased.

Therefore, it is required to reduce the warp amount associated with the thermal process of the semiconductor chip 10. For example, the warp amount of the semiconductor chip 10 is preferably 20 μm or less, more preferably 5 μm or less.

Figure 7A:
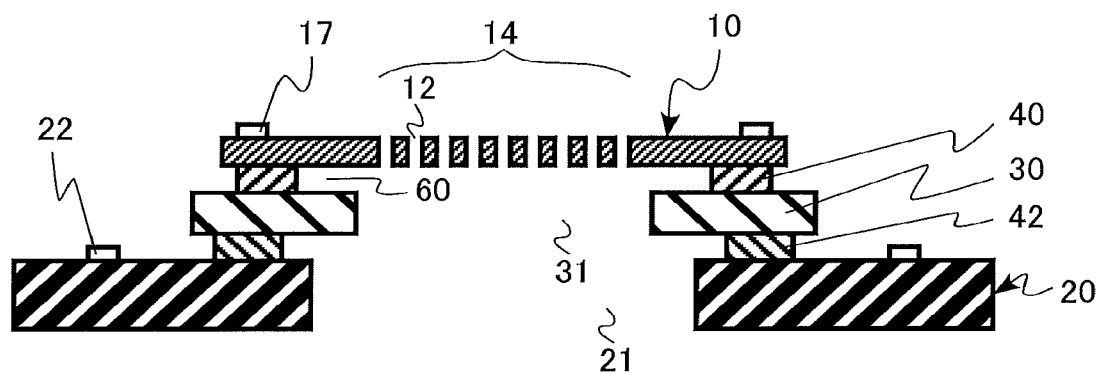
FIGS. 7A and 7B are explanatory views illustrating functions and effects of the semiconductor device according to the embodiment.
Figure 7B:
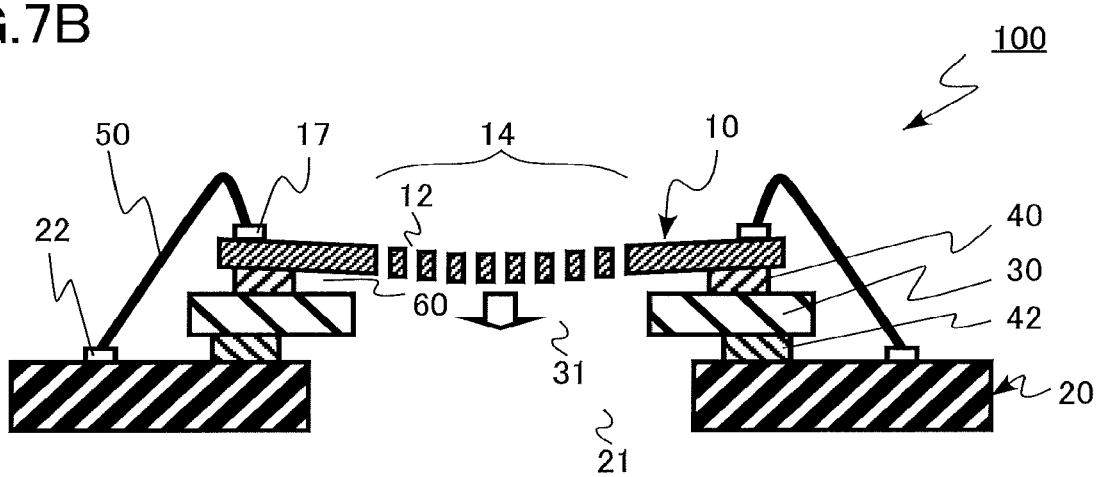

FIGS. 7A and 7B are explanatory views illustrating functions and effects of the semiconductor device according to the embodiment. FIGS. 7A and 7B are schematic cross-sectional views illustrating the semiconductor device according to the embodiment.

FIG. 7A is a view illustrating a state after the semiconductor chip 10 is mounted on the spacer 30. FIG. 7A is a view illustrating a state before a thermal process associated with bonding and wire bonding is performed. FIG. 7B is a view illustrating a state after a thermal process associated with bonding and wire bonding is performed.

In the deflector 100 according to the embodiment, as illustrated in FIG. 7B, the warp of the semiconductor chip 10 after the thermal process is smaller than that of the deflector 900 according to the comparative embodiment.

FIG. 4A is a cross-sectional view illustrating an ideal state in which the warp of the semiconductor chip 10 by the thermal process is ignored.

Figure 8:
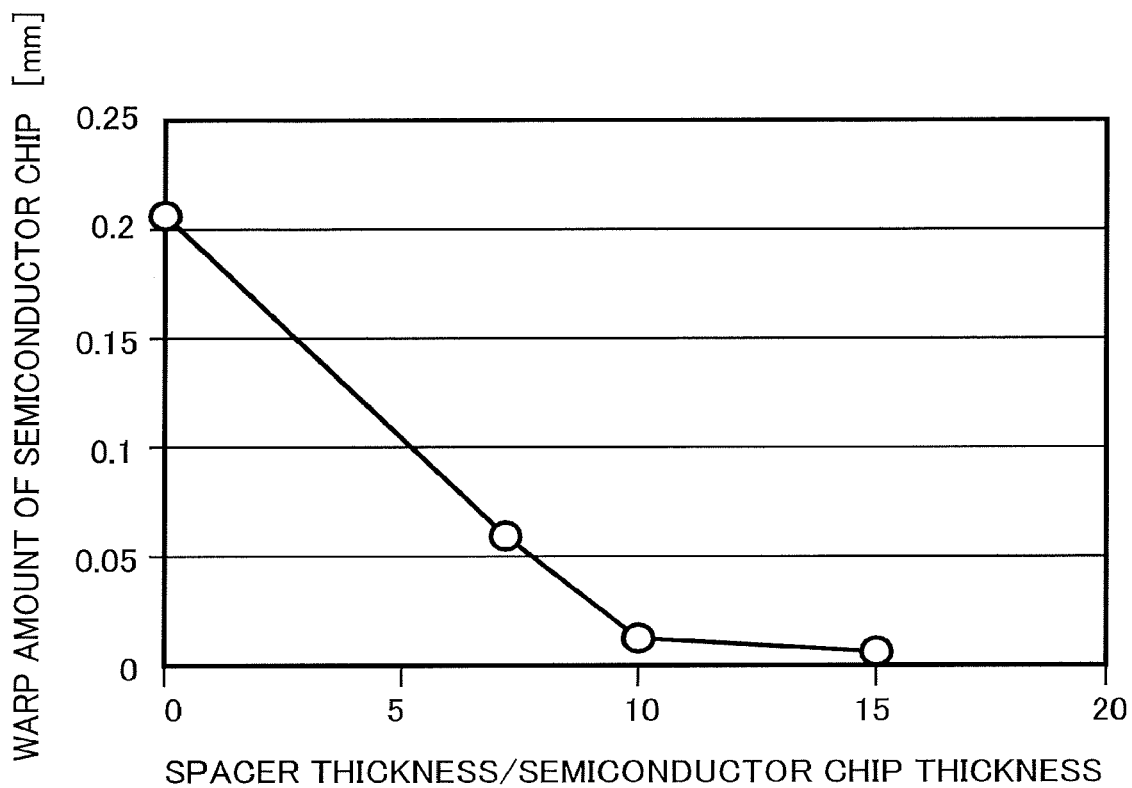
FIG. 8 is an explanatory view illustrating functions and effects of the semiconductor device according to the embodiment.

FIG. 8 is an explanatory view illustrating the functions and effects of the semiconductor device according to the embodiment. The relationship between the warp amount of the semiconductor chip 10 and the ratio of a thickness of the spacer 30 to a thickness of the semiconductor chip 10 (spacer thickness/semiconductor chip thickness) is illustrated.

In acquiring the data of FIG. 8, silicon is used for the semiconductor chip 10 and a printed substrate including a resin is used for the substrate 20. Silicon is used for the spacer 30. The point where the spacer thickness/semiconductor chip thickness is "0" indicates the warp amount of the semiconductor chip 10 in the deflector 900 according to the comparative embodiment having no spacer 30.

As apparent from FIG. 8, by providing the spacer 30, the warp amount of the semiconductor chip 10 is greatly reduced. If the spacer thickness/semiconductor chip thickness is 10 or more, the warp amount becomes 1/10 or less as compared with a case where there is no spacer 30 (spacer thickness/semiconductor chip thickness≈0).

In the deflector 100 according to the embodiment, it is considered that, by providing the spacer 30, the warp amount of the semiconductor chip 10 is greatly reduced because the stress applied to the semiconductor chip 10 caused by the thermal contraction of the substrate 20 during the thermal process is alleviated by the spacer 30 and the first bond 40 that become cushioning materials.

The thermal expansion coefficient of the spacer 30 is preferably smaller than the thermal expansion coefficient of the substrate 20. Normally, the thermal expansion coefficient of the semiconductor chip 10 is smaller than the thermal expansion coefficient of the substrate 20 containing a resin or a ceramic. By making the thermal expansion coefficient of the spacer 30 smaller than the thermal expansion coefficient of the substrate 20, the difference in thermal expansion coefficient between the spacer 30 and the semiconductor chip 10 is decreased. Therefore, the stress applied to the semiconductor chip 10 caused by the thermal contraction of the substrate 20 is reduced, and the warp amount of the semiconductor chip 10 can be reduced.

For example, in a case where the substrate 20 is a printed board including a resin, the thermal expansion coefficient is about 15 ppm/K. In addition, for example, in a case where the substrate 20 is a ceramic board, the thermal expansion coefficient is about 7 ppm/K.

For example, in a case where the semiconductor chip 10 is made of silicon, the thermal expansion coefficient is about 3 ppm/K. In addition, for example, in a case where the semiconductor chip 10 is made of silicon carbide, the thermal expansion coefficient is about 4 ppm/K to 5 ppm/K.

From the viewpoint of decreasing the difference in thermal expansion coefficient between the spacer 30 and the semiconductor chip 10, the thermal expansion coefficient of the spacer 30 is preferably 6 ppm/K or less, and more preferably 5 ppm/K or less.

The thickness of the spacer 30 is preferably sufficiently larger than the thickness of the semiconductor chip 10. By allowing the thickness of the spacer 30 to be larger than the thickness of the semiconductor chip 10, the rigidity of the spacer 30 becomes relatively high, so that the semiconductor chip is difficult to deform. Therefore, the stress applied to the semiconductor chip 10 caused by the thermal contraction of the substrate 20 is reduced, and the warp amount of the semiconductor chip 10 can be reduced. On the other hand, if the spacer is allowed to be made too thick, the deflector 100 becomes too thick, and thus, there is a problem in terms of the forming process or the arrangement space. The ratio of a thickness of the spacer 30 to a thickness of the semiconductor chip 10 (spacer thickness/semiconductor chip thickness) is preferably 5 or more and 50 or less. The ratio of a thickness of the spacer 30 to a thickness of the semiconductor chip 10 is more preferably 8 or more and 20 or less.

The second opening 31 is preferably larger in size than the region 14 and is preferably as small as possible. As the size of the spacer 30 becomes relatively large, the rigidity is increased and the stress applied to the semiconductor chip 10 caused by the thermal contraction of the substrate 20 is reduced. It is also expected that the warp of the semiconductor chip 10 can be suppressed by contact between the lower surface of the deformed semiconductor chip 10 and the upper surface of the spacer 30. Therefore, it is possible to reduce the warp amount of the semiconductor chip 10.

It is preferable that a gap 60 is provided between the spacer 30 and the semiconductor chip 10. The application area of the first bond 40 is decreased, and the bonding area between the spacer 30 and the semiconductor chip 10 is decreased. Therefore, the stress applied to the semiconductor chip 10 caused by the thermal contraction of the substrate 20 is reduced, and the warp amount of the semiconductor chip 10 can be reduced.

As illustrated in FIG. 3B, it is preferable that the first bond 40 is consists of a plurality of portions. It is preferable that the first bond 40 is provided to be divided into a plurality of portions. The application area of the first bond 40 is decreased, and the bonding area between the spacer 30 and the semiconductor chip 10 is decreased. Therefore, the stress applied to the semiconductor chip 10 caused by the thermal contraction of the substrate 20 is reduced, and the warp amount of the semiconductor chip 10 can be reduced.

If the thickness of the first bond 40 is increased, the volume of the first bond 40 is increased, and the effect of alleviating the stress applied to the semiconductor chip 10 is increased. Therefore, the stress applied to the semiconductor chip 10 caused by the thermal contraction of the substrate 20 is reduced, and the warp amount of the semiconductor chip 10 can be reduced. On the other hand, if the first bond 40 is too thick, there is a problem in terms of the heat conduction. The thickness of the first bond 40 is preferably 5 μm or more and 100 μm or less.

From the viewpoint of reducing the amount of deformation of the semiconductor chip 10, the substrate 20, and the spacer 30 in the thermal process and alleviating the stress, it is preferable that the materials of the first bond 40 and the second bond 42 are solidified at a low temperature. The first bond 40 and the second bond 42 are preferably a material having a curing temperature or a melting point of 200° C. or less and more preferably a material having a curing temperature or a melting point of 150° C. or less.

From the viewpoint of alleviating the stress applied to the semiconductor chip 10, the materials of the first bond 40 and the second bond 42 are preferably low elasticity materials.

As described above, according to the embodiment, the stress applied to the semiconductor chip 10 in the thermal process during the manufacturing the deflector 100 is alleviated. Therefore, it is possible to provide the deflector 100 including the semiconductor chip 10 having the through holes 12 arranged with a high positional accuracy.

In the embodiment, a case where the semiconductor chip 10 is formed by using the single semiconductor layer 11 has been described, but for example, the semiconductor chip 10 may be formed by bonding patterns separately formed in two semiconductor layers after the pattern formation.

In the embodiment, a case where the semiconductor layer 11 is a silicon layer has been described as an example, but the semiconductor layer 11 may be another semiconductor material such as a silicon carbide layer.

In the embodiment, a case where the charged particle beam is an electron beam has been described as an example, but the charged particle beam may be another charged particle beam such as an ion beam.

While several embodiments of the invention have been described, these embodiments have been presented as an example and are not intended to limit the scope of the invention. These novel embodiments can be implemented in various other forms, and various omissions, substitutions, and changes can be made without departing from the spirit of the invention. For example, the components of one embodiment may be replaced or changed with components of another embodiment. These embodiments and modifications thereof are included in the scope and spirit of the invention and are included in the invention described in the claims and the equivalent scope thereof.

What is claimed is:

1. A semiconductor device comprising:
   a semiconductor chip including a region having through holes and pairs of electrodes, one of the pairs of electrodes including a first electrode and a second electrode, one of the through holes interposed between the first electrode and the second electrode, the one of the pairs of electrodes configured to deflect a charged particle beam passing through the one of the through holes by applying a voltage between the first electrode and the second electrode;
   a substrate having a first opening larger than the region, the substrate containing a resin or a ceramic;
   a spacer provided between the semiconductor chip and the substrate, the spacer having a second opening larger than the region;
   a first bond provided between the semiconductor chip and the spacer; and a second bond provided between the spacer and the substrate.

2. The semiconductor device according to claim 1, wherein a thermal expansion coefficient of the spacer is smaller than a thermal expansion coefficient of the substrate.

3. The semiconductor device according to claim 1, wherein a thickness of the spacer is larger than a thickness of the semiconductor chip.

4. The semiconductor device according to claim 1, wherein a gap exists between the spacer and the semiconductor chip.

5. The semiconductor device according to claim 1, wherein the first bond is consists of a plurality of portions.

6. The semiconductor device according to claim 1, wherein a thickness of the first bond is 5 µm or more.

7. The semiconductor device according to claim 1, wherein the semiconductor chip includes a first wiring layer and a second wiring layer, and the first wiring layer connected to the first electrode and the second wiring layer connected to the second electrode.

8. The semiconductor device according to claim 1, wherein the second opening is smaller than the first opening.

9. The semiconductor device according to claim 1, wherein a surface of the spacer is covered with a conductive material.

10. The semiconductor device according to claim 1, wherein the semiconductor chip includes a first electrode pad, the substrate includes a second electrode pad, and further including a bonding wire electrically connecting the first electrode pad and the second electrode pad.

11. The semiconductor device according to claim 1, wherein the semiconductor chip includes a silicon layer.

12. The semiconductor device according to claim 1, wherein the spacer includes a semiconductor or an insulator.

13. The semiconductor device according to claim 1, wherein the substrate is a printed board.

14. The semiconductor device according to claim 1, wherein a ratio of a thickness of the spacer to a thickness of the semiconductor chip is 5 or more and 50 or less.

15. The semiconductor device according to claim 1, wherein a curing temperature of the first bond and the second bond is 200° C. or less.

* * * * *